United States Patent
Watanabe et al.

(10) Patent No.: US 8,563,216 B2
(45) Date of Patent: Oct. 22, 2013

(54) SUBSTRATE TO BE PROCESSED HAVING LAMINATED THEREON RESIST FILM FOR ELECTRON BEAM AND ORGANIC CONDUCTIVE FILM, METHOD FOR MANUFACTURING THE SAME, AND RESIST PATTERNING PROCESS

(75) Inventors: Satoshi Watanabe, Jyoetsu (JP); Hiroki Yoshikawa, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 131 days.

(21) Appl. No.: 13/168,446

(22) Filed: Jun. 24, 2011

(65) Prior Publication Data

US 2012/0021341 A1 Jan. 26, 2012

(30) Foreign Application Priority Data

Jul. 23, 2010 (JP) .................................. 2010-165767

(51) Int. Cl.
*G03C 5/00* (2006.01)

(52) U.S. Cl.
USPC ..................... 430/270.1; 430/296; 430/942

(58) Field of Classification Search
USPC ..................... 430/270.1, 296, 942
See application file for complete search history.

(56) References Cited

U.S. PATENT DOCUMENTS

| | | | |
|---|---|---|---|
| 5,288,368 A | 2/1994 | DeMarco et al. | |
| 5,641,715 A | 6/1997 | Okamoto | |
| 5,776,659 A | 7/1998 | Watanabe et al. | |
| 5,837,423 A | 11/1998 | Okamoto | |
| 2005/0277034 A1 | 12/2005 | Mitsui | |
| 2007/0020534 A1 | 1/2007 | Yoshikawa et al. | |
| 2007/0252111 A1 | 11/2007 | Ohkubo et al. | |
| 2008/0241751 A1 | 10/2008 | Takeda et al. | |
| 2010/0009286 A1 | 1/2010 | Takeda et al. | |
| 2010/0261099 A1 | 10/2010 | Yoshikawa et al. | |

FOREIGN PATENT DOCUMENTS

| | | |
|---|---|---|
| JP | A-60-74521 | 4/1985 |
| JP | A-04-333051 | 11/1992 |
| JP | A-06-035173 | 2/1994 |
| JP | A-06-224117 | 8/1994 |
| JP | A-8-109351 | 4/1996 |
| JP | A-2001-230197 | 8/2001 |
| JP | A-2005-191250 | 7/2005 |
| JP | A-2005-286208 | 10/2005 |
| JP | A-2005-345737 | 12/2005 |
| JP | A-2006-117925 | 5/2006 |
| JP | A-2007-33469 | 2/2007 |
| JP | A-2007-241060 | 9/2007 |
| JP | A-2008-46650 | 2/2008 |
| JP | A-2008-70881 | 3/2008 |
| JP | A-2008-249762 | 10/2008 |
| JP | A-2010-20173 | 1/2010 |
| WO | WO 2009/093661 A1 | 7/2009 |

OTHER PUBLICATIONS

Sep. 25, 2012 Japanese Office Action issued in Japanese Application No. 2010-165767 (with partial translation).
Plontke, R. et al., "Avoidance/reduction of charging effects in case of partially insufficient substrate conductivity when using ESPACER 300Z," *20th European Conference on Mask Technology for Integrated Circuits and Microcomponents, Proceedings of SPIE*, 2004, pp. 188-196, vol. 5504.
Kamikubo, T. et al., "Study of Heating Effect on CAR in Electron Beam Mask Writing," *Photomask and Next-Generation Lithography Mask Technology XIV, Proceedings of SPIE*, 2007, pp. 660723-1-660723-9, vol. 6607.
Extended European Search Report issued in European Patent Application No. 11005204.0 on Jan. 17, 2012.
May 14, 2013 Office Action issued in Chinese Patent Application No. 201110214208.X (with partial translation).

*Primary Examiner* — Christopher Young
(74) *Attorney, Agent, or Firm* — Oliff & Berridge, PLC

(57) ABSTRACT

There is disclosed a substrate to be processed having laminated thereon a resist film for electron beam and an organic conductive film, in which at least a resist film for electron beam and an organic conductive film are laminated in order on a substrate to be processed having a conductive inorganic thin film as its surface layer, wherein a surface to be processed of the substrate to be processed has an area of direct contact between the organic conductive film and the conductive inorganic thin film in part thereof. There can be a substrate to be processed capable of forming a resist pattern stably and accurately with efficient removal of electricity even when an electron beam with high current density is irradiated.

19 Claims, 5 Drawing Sheets

SUBSTRATE TO BE PROCESSED HAVING LAMINATED THEREON RESIST FILM FOR ELECTRON BEAM AND ORGANIC CONDUCTIVE FILM, METHOD FOR MANUFACTURING THE SAME, AND RESIST PATTERNING PROCESS

BACKGROUND OF THE INVENTION

1. Field of the Invention

The present invention relates to a substrate to be processed (precursor substrate for processing) having a metal film or a metal compound film to be microfabricated by an electron beam lithography and having laminated thereon a resist film for electron beam and an organic conductive film and, a method for producing the substrate to be processed, and a resist patterning process by using the substrate to be processed; in particular, the present invention relates to a photomask blank having laminated thereon a resist film for electron beam and an organic conductive film used for producing a photomask used in microfabrication of a semiconductor integrated circuit, CCD (Charge Coupled Device), a color filter for LCD (Liquid Crystal Display), a magnetic head, and the like.

2. Description of the Related Art

In recent years, especially with progress of a large-scale integrated circuit toward higher integration in semiconductor processing, requirement of miniaturization in a circuit pattern is increasing more than ever, so that requirement of a further finer line of a wiring pattern to constitute a circuit and requirement of a miniaturization technology in a contact hole pattern for wiring among layers that constitute a cell are increasing more and more. Accordingly, with the progress of miniaturization, a technology to draw a circuit pattern more finely and accurately is also sought in production of a photomask drawn with a circuit pattern used in a photolithography to form the wiring pattern and the contact hole pattern as mentioned above.

Meanwhile, in general, the forgoing photomask processing is carried out by a method wherein a resist film is formed on a photomask blank having an optical film such as a light-shielding film and a phase shift film formed on a transparent substrate absorbing almost no exposing light or, on the contrary, on a substrate reflecting an exposing light, then an electron beam is irradiated onto the resist film thus formed to make a resist pattern, which is then transferred to the light-shielding film or the phase shift film by etching.

In this processing, formation of the resist pattern by irradiation of an electron beam must be conducted with an extremely accurate positioning; but because a resist film usually used is an insulator, an electric accumulation (charge-up) occurs in the resist film sometimes. Because of this charge-up effect, the electron beam irradiated onto a photomask blank surface is distorted thereby causing a slight misalignment in the resist pattern position formed, namely causing a decrease in the resist pattern accuracy.

To prevent the charge-up from occurring during patterning by irradiation of an electron beam on a resist film, it is known that a method, wherein an electron beam is irradiated to a conductive polymer layer formed on a resist film, is effective—and for example, a method also usable on a chemical amplification resist is disclosed in Japanese Patent Laid-Open (Kokai) No. H08-109351 and Japanese Patent Laid-Open (Kokai) No. 2006-117925.

SUMMARY OF THE INVENTION

An electron beam lithography has been an ordinarily used technology also in a conventional photomask blank processing; in this case, the charge-up problem as mentioned above has been solved usually by a method wherein a certain degree of conductivity is given to an inorganic thin film as a surface layer of a photomask blank thereby removing an electric charge of a resist film through the inorganic conductive thin film as the foregoing surface layer, not by a method wherein an organic conductive film is formed on a resist film.

Namely, in the case that an electric charge on a photomask blank surface during an electron beam drawing is to be removed, a method, wherein a surface of a conductive inorganic thin film near the photomask blank edge arranged on a stage is connected to earth, so that an electric charge that is being built up on the photomask blank surface during drawing may be removed thereby preventing the charge-up, is generally employed.

However, as mentioned above, because of progress of miniaturization in a photomask pattern and requirement of improvement in throughput during electron beam irradiation, in the electron beam irradiation used for resist pattern drawing, there is a tendency that an acceleration voltage is increased so that further higher resolution may be obtained, and at the same time an electric currency per unit area is increased so that deterioration of sensitivity due to the increase in the acceleration voltage may be prevented. This increase in an electric currency per unit area causes the charge-up problem more easily, so that the electricity removal only from a bottom part of the resist film through a surface layer of the photomask blank is not adequate any more.

The present invention was made in view of the situation as mentioned above, and has an object to provide a substrate to be processed whose electricity can be removed efficiently, so that a resist pattern having high accuracy may be formed stably even if an electron beam with a high current density is irradiated.

In order to solve the problems as mentioned above, inventors of the present invention carried out patterning by an electron beam irradiation without success in removal of adequate electricity, when on a photomask blank was formed a resist film for electron beam, on which was further formed an organic conductive film while the organic conductive film was connected to earth so that the charge-up might not take place even if an electric currency per unit area was increased at the time of conducting a lithography of a photomask blank having on its surface layer a chromic material film as a conductive inorganic thin film. Alternatively, after an organic conductive film was formed, the organic conductive film and the resist film for electron beam were delaminated in the part which was connected to earth, and the chromic material film was connected directly to earth; in this case, an adequate effect could not be obtained either.

Accordingly, inventors of the present invention assumed a working hypothesis that the reason not to obtain a satisfactory effect by the foregoing attempts might reside in insufficient removal of electricity; and based on this assumption, the earth was connected in a manner that two conductive films each formed above and below the resist film for electron beam could have an area where two films were made directly contacted in part thereof on a surface to be processed of the substrate to be processed, and then they found that electricity could be removed sufficiently, thereby completing the present invention.

According to the present invention, provided is a substrate to be processed having laminated thereon a resist film for electron beam and an organic conductive film, in which at least a resist film for electron beam and an organic conductive film are laminated in order on a substrate to be processed having a conductive inorganic thin film as its surface layer, wherein a surface to be processed of the substrate to be processed has an area of direct contact between the organic conductive film and the conductive inorganic thin film in part thereof.

The substrate to be processed having laminated thereon a resist film for electron beam and an organic conductive film, as mentioned above, has an area of direct contact between a conductive inorganic thin film and an organic conductive film in part thereof, each formed above and below the resist film for electron beam, whereby giving a configuration that resistance of charge transfer between the conductive inorganic thin film and the organic conductive film is made low so that, even if an electron beam with a high current density is irradiated, electricity may be removed not only from a substrate side of the resist film for electron beam but also from its surface side; and thus, a resist pattern having high accuracy can be formed stably.

It is preferable that the surface to be processed of the substrate to be processed has an area where the conductive inorganic thin film is appeared out.

When, as mentioned above, the substrate to be processed having laminated thereon a resist film for electron beam and an organic conductive film, has an area where the conductive inorganic thin film is appeared out (area where the conductive inorganic thin film is exposed) on the surface to be processed of the substrate to be processed, the case that the inorganic conductive film is connected to earth because of an equipment requirement and so on has a merit; and in addition, dusting during transportation can be prevented.

It is preferable that the area where the conductive inorganic thin film is appeared out is arranged with a certain width in a surrounding area inside the surface to be processed than a virtual intersection line between a side surface of the substrate to be processed and the surface to be processed of the substrate to be processed, and the area of direct contact between the organic conductive film and the conductive inorganic thin film is arranged in a peripheral form with a prescribed width inside the surface to be processed than the surrounding area having a certain width.

When the substrate to be processed having laminated thereon a resist film for electron beam and an organic conductive film, as mentioned above, is used, the surface to be processed of the substrate to be processed can be made to have an area of direct contact between the organic conductive film and the conductive inorganic thin film in part thereof in a peripheral form with a prescribed width, and outside thereof an area formed where the conductive inorganic thin film is appeared out; and as a result, a resist pattern having high accuracy can be formed stably, and in addition, an earth can be arranged more easily and dusting during transportation can be prevented as well.

In addition, it is preferable that the width of the area of direct contact between the organic conductive film and the conductive inorganic thin film, arranged in a peripheral form with a prescribed width, be 0.3 mm or more.

When the width of the area of direct contact between the organic conductive film and the conductive inorganic thin film, arranged in a peripheral form with a prescribed width, is 0.3 mm or more, an electric charge can be transferred between the organic conductive film and the conductive inorganic thin film more surly.

In addition, it is preferable that the substrate to be processed be a photomask blank.

As mentioned above, a photomask blank may be mentioned as the substrate to be processed. Generally, resist patterning by an electron beam irradiation during photomask processing needs to be performed with an extremely accurate positioning; and thus, a photomask blank can be used effectively as the substrate to be processed of the substrate to be processed having laminated thereon a resist film for electron beam and an organic conductive film according to the present invention.

In addition, the present invention provides a resist patterning process, wherein the substrate to be processed having laminated thereon a resist film for electron beam and an organic conductive film is used and the conductive inorganic thin film or the organic conductive film is connected to earth, and thereafter pattern-irradiation is conducted on the resist film for electron beam formed on the substrate to be processed by using an electron beam having current density of 10 A/cm$^2$ or more per unit time.

When the substrate to be processed having laminated thereon a resist film for electron beam and an organic conductive film according to the present invention, is pattern-irradiated by an electron beam while the conductive inorganic thin film or the organic conductive film is connected to earth as mentioned above, pattern-irradiation of high accuracy with an acceptable throughput can be conducted without causing a charge-up phenomenon even if irradiation by an electron beam is carried out under the condition of high current density of 10 A/cm$^2$ or more per unit time.

In addition, the present invention provides a method for manufacturing a substrate to be processed having laminated thereon a resist film for electron beam and an organic conductive film in which at least a resist film for electron beam and an organic conductive film are laminated in order on a substrate to be processed having a conductive inorganic thin film as its surface layer,
wherein the method comprises at least:

(1) a step of forming a resist film for electron beam on entire of a substrate to be processed and removing a part of the resist film for electron beam, thereby forming an area where a conductive inorganic thin film as a surface layer of the substrate to be processed is appeared out, and (2) a step of forming the organic conductive film on entire of the substrate to be processed having laminated thereon the partly removed resist film for electron beam; and thereby a substrate to be processed having laminated thereon a resist film for electron beam and an organic conductive film, whose surface to be processed has an area of direct contact between the organic conductive film and the conductive inorganic thin film in part inside the area where the conductive inorganic thin film is appeared out by removing a part of the resist film for electron beam, is manufactured.

When, as mentioned above, a part of the formed resist film for electron beam is removed, thereby forming an area where the conductive inorganic thin film as a surface layer of the substrate to be processed may be appeared out, and then the organic conductive film is formed on entire of the substrate to be processed, the conductive inorganic thin film and the organic conductive film can be formed with excellently uniform thickness, and in addition, a substrate to be processed, having an area of direct contact between the organic conductive film and the conductive inorganic thin film contact in part, can be manufactured more conveniently.

In addition, it is preferable that removal of the resist film for electron beam in the step (1) is conducted in a substrate surrounding area with a certain first width inside the surface to be processed than a virtual intersection line between the side surface of the substrate to be processed and the surface to be processed of the substrate to be processed.

When, as mentioned above, removal of the resist film for electron beam in the foregoing step (1) is conducted in a substrate surrounding area with a certain first width inside the surface to be processed than a virtual intersection line between the side surface of the substrate to be processed and the surface to be processed of the substrate to be processed, the area of direct contact between the organic conductive film and the conductive inorganic thin film of the substrate to be processed in part can be formed in the subsequent step. In addition, it is preferable that the resist film for electron beam be removed in a certain width in a peripheral form along a peripheral edge of the substrate in the way as mentioned above so that dusting may be prevented when contacted with a holding equipment and a jig during transportation and the like after all of the films are formed.

In addition, it is preferable that, after the step (2), the organic conductive film be removed in a peripheral form with a certain second width inside the surface to be processed than a virtual intersection line between the side surface of the substrate to be processed and the surface to be processed of the substrate to be processed, wherein the certain second width is narrower than the certain first width by 0.3 mm or more, and the surface to be processed of the substrate to be processed has the area of direct contact between the organic conductive film and the conductive inorganic thin film in part inside than the area where the conductive inorganic thin film is appeared out.

When, as mentioned above, after the foregoing step (2), the organic conductive film is removed in a peripheral form with a certain second width inside the surface to be processed than a virtual intersection line between the side surface of the substrate to be processed and the surface to be processed of the substrate to be processed, and the certain second width is made to be narrower than the certain first width by 0.3 mm or more, the surface to be processed of the substrate to be processed has the area of direct contact between the organic conductive film and the conductive inorganic thin film in part can be formed inside than the area where the conductive inorganic thin film is appeared out, and in addition, a structure ensuring an electric charge transfer between the organic conductive film and the conductive inorganic thin film can be formed.

The substrate to be processed having laminated thereon a resist film for electron beam and an organic conductive film according to the present invention, whose surface to be processed of the substrate to be processed has an area of direct contact between the conductive inorganic thin film and the organic conductive film, arranged above and below the resist film for electron beam, thereby lowering the resistance to an electric charge transfer between the conductive inorganic thin film and the organic conductive film; and as a result, electricity can be removed not only from the substrate side of the resist but also from the surface side thereof even when an electron beam with high current density is irradiated; and thus, a resist pattern having high accuracy can be formed stably.

DETAILED DESCRIPTION OF THE PREFERRED EMBODIMENTS

Figure 1:
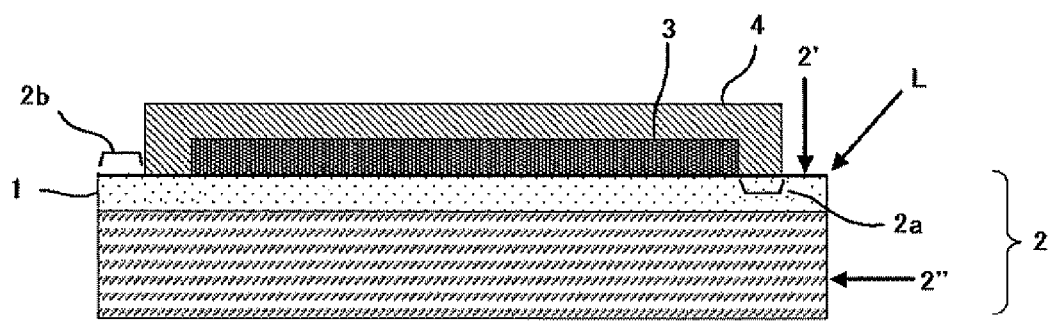
FIG. 1 is a diagram showing one example of the substrate to be processed having laminated thereon a resist film for an electron beam and an organic conductive film according to the present invention.

Hereinbelow, the present invention will be explained more specifically.

The substrate to be processed of the present invention is a substrate to be processed—having on its surface layer a conventional inorganic thin film which is considered to have such degree of conductivity that an electric charge generated by an electron beam irradiation may be removed through earth (ground)—including a photomask blank as the material for manufacturing a photomask, a semiconductor-processing intermediate manufactured from a silicon wafer for manufacturing of a semiconductor device, and a substrate for nanoinprinting (here, conductivity means such degree of conductivity that an electric charge can be removed; and thus the property showing the sheet resistivity of about 100 or less MΩ/square is called conductivity).

Usually, in the case that a resist pattern is obtained by pattern-irradiation of an electron beam onto a resist film for electron beam formed on a substrate to be processed having a conductive inorganic thin film, because an organic film such as a resist film for electron beam has low conductivity, charge-up in the resist film for electron beam has been prevented by the method wherein the conductive inorganic thin film is appeared out by removing a part of the resist film for electron beam and the conductive inorganic thin film is directly connected to earth thereby removing an electric charge generated in the resist film for electron beam through the conductive inorganic thin film.

On the other hand, as mentioned above, if an acceleration voltage during electron beam irradiation is increased to obtain further higher resolution, there is a tendency of decrease in resist sensitivity; and thus a method that an irradiation density of the irradiating electron beam is simultaneously increased is employed in order not to deteriorate throughput even if the acceleration voltage is increased. The minimum pattern line width during resist patterning, desired in nowadays electron beam lithography, is almost as narrow as 50 nm or less depending on its form; and in the case like this, conditions such as, for example, an electron beam acceleration voltage of 50 kV and an irradiation current density of 40 A/cm$^2$ or more are employed. However, if an electron beam is irradiated under the foregoing conditions on a formed resist film having a thickness of, for example, about 100 nm, complete prevention of charge-up becomes difficult depending on an intended pattern.

Inventors of the present invention assumed a working hypothesis that, in order to prevent charge-up more effectively, improvement of efficiency in removal of electricity is important; and thus carried out extensive investigation on a mechanism with which electricity can be removed efficiently from the upper and lower surfaces of the resist film for electron beam. As a result, the inventors came to an idea that electricity might be efficiently removed from both upper and lower surfaces of the resist film for electron beam if a structure, having a configuration that the low-conductive resist film for an electron beam is sandwiched between the conductive inorganic thin film and the organic conductive film so that both films may contact directly in part on the surface to be processed of the substrate to be processed, is employed and the conductive inorganic thin film or the organic conductive film is connected to earth. The substrate to be processed, having a structure that the conductive inorganic thin film and the organic conductive film contact directly in part as mentioned above, will be described in detail in the following.

The substrate to be processed having laminated thereon a resist film for electron beam and an organic conductive film according to the present invention, has, as shown in FIG. 1, a configuration that at least the resist film for electron beam 3 and the organic conductive film 4 are laminated in order on the substrate to be processed 2 having the conductive inorganic thin film 1 as its surface layer, and further the surface to be processed 2' of the substrate to be processed 2 has the area 2a of direct contact between the organic conductive film 4 and the conductive inorganic thin film 1 in part thereof.

When, as mentioned above, a configuration that the conductive inorganic thin film 1 and the organic conductive film 4 arranged above and below the resist film for electron beam 3 contact directly in part is employed, the resistance of charge transfer between the conductive inorganic thin film 1 and the organic conductive film 4 can be made lower; and as a result, electricity can be removed not only from the substrate side but also from the surface side of the resist film for electron beam 3, thereby enabling to form a resist pattern stably with high accuracy even if an electron beam having high current density is irradiated.

The substrate to be processed 2 having laminated thereon the resist film for electron beam 3 and the organic conductive film 4 according to the present invention, is not particularly restricted as far as the surface to be processed 2' of the substrate to be processed 2 has the area 2a of direct contact between the organic conductive film 4 and the conductive inorganic thin film 1 in part thereof, as mentioned above; and thus, a configuration having the area 2b where the conductive inorganic thin film 1 is appeared out on the surface to be processed 2' of the substrate to be processed 2, as shown in FIG. 1, may be employed. The configuration having the area 2b where the conductive inorganic thin film 1 is appeared out (the area where the conductive inorganic thin film 1 is exposed), as mentioned above, is especially effective in the case that earthing the substrate from the conductive inorganic thin film 1 is necessary and that dusting during transportation needs to be prevented eagerly.

It can be made that the area 2b where the conductive inorganic thin film 1 is appeared out is formed with a certain width in a surrounding area inside the surface to be processed 2' than a virtual intersection line L between the side surface of the substrate to be processed 2'' and the surface to be processed 2' of the substrate to be processed 2, and that the area 2a of direct contact between the organic conductive film 4 and the conductive inorganic thin film 1 is arranged in a peripheral form with a prescribed width inside the surface to be processed 2' than the foregoing surrounding area having a certain width.

In addition, when the width of the area 2a of direct contact between the organic conductive film 4 and the conductive inorganic thin film 1 is 0.3 mm or more, charge transfer between the organic conductive film 4 and the conductive inorganic thin film 1 can take place more surely.

Then, the method for manufacturing a substrate to be processed having laminated thereon a resist film for electron beam and an organic conductive film according to the present invention, will be explained.

Here, generally an entire surface to be processed of a substrate to be processed is coated with a resist film in the case that a resist film and an organic conductive film are formed on the substrate to be processed. Alternatively, depending on the coating method, it is possible to form an area where coating is not made; and thus, it is possible to employ a method that an organic conductive film is formed entirely on a surface to be processed after a resist film is formed in a limited area. However, a configuration in which a conductive inorganic thin film and an organic conductive film are formed simply with an adequately uniform thickness and the conductive inorganic thin film and the organic conductive film contact directly in part may be formed by the procedure as shown below.

Figure 2:
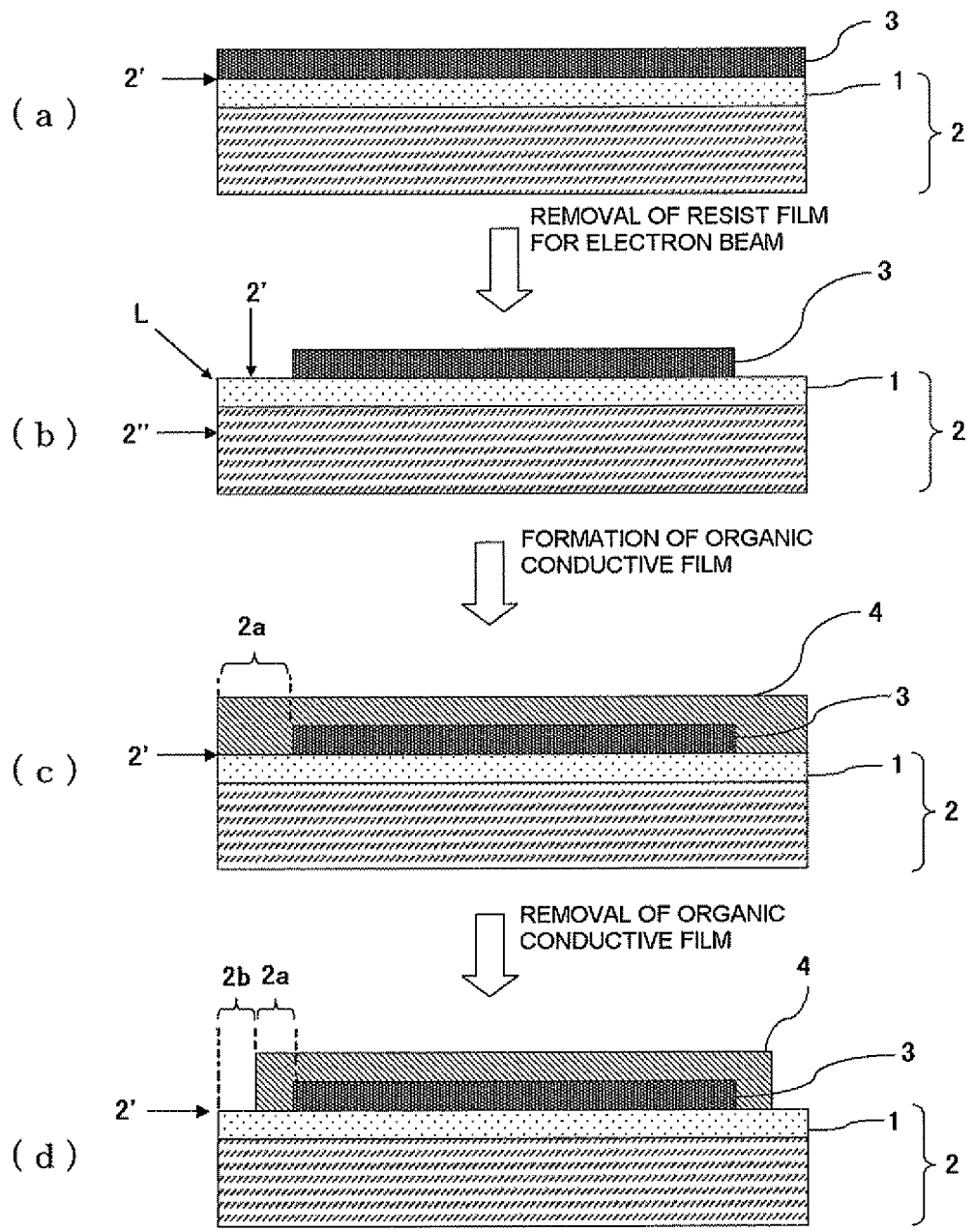
FIG. 2 is a flow diagram illustrating the method to manufacture a substrate to be processed having laminated thereon a resist film for electron beam and an organic conductive film according to the present invention.

In FIG. 2, a flow diagram, illustrating the method to manufacture a substrate to be processed having laminated thereon a resist film for electron beam and an organic conductive film according to the present invention, is shown.

Firstly, the resist film for electron beam 3 is applied on entire of the surface to be processed 2' of the substrate to be processed 2 having the conductive inorganic thin film 1 as its surface layer (FIG. 2A). To form the resist film for electron beam 3 having uniform thickness, a spin coating method is most suitable; but an alternative method such as a scan coating method may be used. Here, the resist film for electron beam 3 is formed by applying a composition solution for forming the resist film for electron beam onto entire of the substrate to be processed 2, wherein an excess solvent used in the application may be removed by heating, immediately after application or after a part of the resist film for electron beam 3 is removed in a subsequent step. Meanwhile, conditions of application, heating after the application, and so on, are selected in view of most suitably recommended conditions for respective resists to be used.

Then, to form the area of direct contact between the conductive inorganic thin film 1 and the organic conductive film 4 on the surface to be processed 2' of the substrate to be processed 2, a part of the formed resist film for electron beam 3 is removed (FIG. 2B). Here, removal of the resist film for electron beam 3 can be conducted most easily by using an organic solvent capable of dissolving the resist film for electron beam 3. This partial removal of the coated resist film for electron beam 3 may be conducted by referring to a method for removing a resist on the substrate edge (see for example, Japanese Patent Laid-Open (Kokai) No. 2005-286208 and Japanese Patent Laid-Open (Kokai) No. 2008-46650), which is conducted occasionally, for example, to prevent dusting during transportation of a photomask blank.

The area to be removed in the resist film for electron beam 3 may be, for example, a square in about 5 mm of a side because, in the narrowest case, only the area where an earth can be set may be sufficient. However, in the case that the substrate to be processed 2 is in a quadrangular form, for example, such as a photomask blank, it is preferable, in view of workability, to remove along at least one side with a certain width in order to make the contacting area large so that the patternable area may be enlarged. In the case of contacting with a holding equipment and a jig during transportation and the like after all of the films are formed as described above, it is preferable that, in order to prevent dusting from occurring, removal be made with a certain width (hereinafter a first certain width) inside the surface to be processed 2' than a virtual intersection line L between the side surface 2" of the substrate to be processed and the surface to be processed 2' of the substrate to be processed 2, namely, removal be made in a peripheral form along an edge peripheral of the substrate to be processed 2. For example, the width of the peripheral area is preferably 1.3 to 2.5 mm.

In removal of the resist film for electron beam 3, any of heretofore known solvents may be used. The illustrative example includes a propylene glycol monoalkyl ether, a propylene glycol monoalkyl ether ester, and a lactate ester; in addition, a polyoxyethylene alkyl ether, a polyoxyethylene alkyl allyl ether, an aliphatic monoacid ester, ketones such as acetone, methyl butyl ketone, cyclopentanone, and cyclohexanone, and esters such as ethyl acetate, butyl acetate, and amyl acetate; and so on, used as a resist solvent. These solvents may be used also as a mixture of them; and in addition, they may be added with an additive such as a surfactant.

Then, a composition for forming the organic conductive film is applied onto entire of the substrate to be processed 2 from on the surface to be processed 2 after partial removal of the resist film for electron beam 3 as mentioned above and from on the resist film for electron beam 3, whereby forming the organic conductive film 4 (FIG. 2C). When the film is formed in a way as mentioned above, the area 2a of direct contact between the conductive inorganic thin film 1 and the organic conductive film 4 is formed in the area where the resist film for electron beam 3 on the surface to be processed 2' of the substrate to be processed 2 is removed by the procedures as mentioned above. The area of direct contact between the conductive inorganic thin film 1 and the organic conductive film 4 can have an effect when the width of the area is wider by a certain value; and thus, a part of the organic conductive film 4 in the area—where the conductive inorganic thin film 1 and the organic conductive film 4 contact directly—which is made by forming the organic conductive film 4 in the area where the resist film for electron beam 3 is removed, can be removed.

Accordingly, in the case that earthing the substrate from the conductive inorganic thin film 1 is necessary because of an equipment requirement and so on, and that prevention of dusting during transportation is eagerly desired as mentioned above, in the organic conductive film 4 formed on entire of the substrate to be processed by the foregoing procedures, a part of the organic conductive film 4 in the area where the resist film for electron beam 3 is removed before formation of the organic conductive film 4 is removed, namely, a part of the area where the conductive inorganic thin film 1 and the organic conductive film 4 contact directly is removed, thereby forming the area 2b, where the conductive inorganic thin film is appeared out along the peripheral edge of the substrate to be processed 2, in a peripheral form with a certain width inside the surface to be processed 2' than a virtual intersection line L between the substrate's side surface 2" and the surface to be processed 2' of the substrate to be processed 2, in a manner that the area 2a of direct contact between the conductive inorganic thin film 1 and the organic conductive film 4 may be left (FIG. 2D).

In the case that the organic conductive film 4 is removed, if removal is done as far as toward the peripheral edge of the area where the resist film for electron beam 3 is formed, film thickness of the organic conductive film 4 in the stage part between the area of the resist film for electron beam 3 and the area where the resist film for electron beam 3 is removed becomes so thin that risks of short circuit and decrease in efficiency for removal of electricity may appear; and thus, it is preferable that the removal be done in a manner that the width of at least a part having the maximum width in the area 2a of direct contact between the conductive inorganic thin film 1 and the organic conductive film 4 may not be 0.3 mm or less from the edge part of the resist film for electron beam 3 to the outside direction of the surface to be processed 2'.

Especially in the case that removal of the organic conductive film 4 on the peripheral part of the substrate to be processed 2 is conducted as the dust preventive measure as mentioned above, if the resist film for electron beam 3 is removed along the peripheral edge of the substrate in a peripheral form with a certain first width inside the surface to be processed 2' than a virtual intersection line L between the substrate's side surface 2" and the surface to be processed 2' of the substrate to be processed 2, the area 2a of direct contact between the conductive inorganic thin film 1 and the organic conductive film 4 remains by conducting, after the organic conductive film 4 is applied entirely, the removal of the organic conductive film 4 along the peripheral edge of the substrate in a peripheral form with a certain second width, which is narrower than the certain first width, inside the surface to be processed 2' than a virtual intersection line L between the substrate's side surface 2" and the surface to be processed 2' of the substrate to be processed 2. Here, the certain second width is preferably narrower than the certain first width by 0.3 mm or more. In this way, a structure that charge transfer between the organic conductive film 4 and the conductive inorganic thin film 1 can take place easily can be prepared.

Removal of the organic conductive film 4 in the way as mentioned above can be conducted by selecting a solvent in accordance with a material to form the organic conductive film 4 by referring to the foregoing removal method of the resist film for electron beam 3. The solvent to be used is based on a solvent used in a composition solution for forming the organic conductive film, and is generally prepared by adding a substance to accelerate dissolution further, such as an acidic or a basic compound and a surfactant, to water or a mixture of water with an organic solvent.

Figure 3:
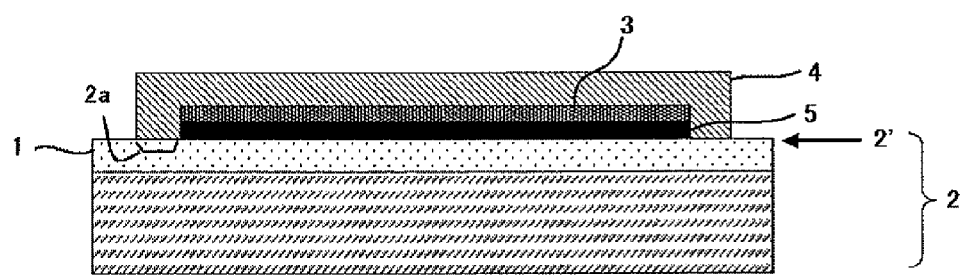
FIG. 3 is a diagram showing another example of the substrate to be processed having laminated thereon a resist film for an electron beam and an organic conductive film according to the present invention.

Meanwhile, a special case that the resist film for electron beam 3 as mentioned above is the resist film for electron beam 3 for a multilayer resist method will be simply explained by referring to FIG. 3. In the case that a multilayer resist method is used, the process auxiliary film 5 is arranged between the substrate to be processed 2 and the resist film for electron beam 3 (see, for example, Japanese Patent Laid-Open (Kokai) No. 2008-70881). This auxiliary film is formed in a manner not to cause intermixing with a resist composition for electron beam. Therefore, in the case that the process auxiliary film 5 is arranged, the area 2a where the conductive inorganic thin film 1 and the organic conductive film 4 contact directly needs to be formed by removing a part of the process auxiliary film 5 after the auxiliary film is formed on entire of the substrate to be processed and before the resist film for electron beam 3 is applied. Here, it is preferable that the area where the process auxiliary film 5 is removed coincide with the area where the resist film for electron beam 3 is removed; but misalignment in such a degree not to cause an adverse effect on patterning may not pose a particular problem. However, as explained above in the method for removing the resist film for electron beam 3 and the organic conductive film 4, in order to form an effective contact area between the organic conductive film 4 and the conductive inorganic thin film 1, it is preferable that the organic conductive film 4 be formed or a part thereof be removed after formation thereof, in a manner that the width of the contact area may be 0.3 mm or more.

In the case that an electron beam is irradiated on the substrate to be processed 2 having the conductive thin film 1 and having laminated thereon the resist film for electron beam 3 and the organic conductive film 4, obtained as described above, while having the area 2a of direct contact between the organic conductive film 4 and the conductive inorganic thin film 1 at least on one point of the surface to be processed 2' of the substrate to be processed 2, electricity can be removed from above and below the resist film for electron beam 3 by earthing any part of the surface to be processed 2' of the substrate. However, in the usually used device, an earth is arranged so as to contact with the chamfer formed between the surface to be processed 2' and the substrate's side 2"; and thus, an electric charge is removed by contacting the organic conductive film 4 with the chamfer in the case that the edge part of the organic conductive film 4 is not removed. On the other hand, in the case that the edge part of the organic conductive film 4 is removed as the preventive measure of dusting, an earth contacts with the conductive inorganic thin film 1 at the intersection point between the chamfer and the surface to be processed 2'; in this case too, removal of electricity can be done without a problem.

When, as mentioned above, pattern irradiation of an electron beam is conducted with earthing the substrate to be processed 2 of the present invention, pattern irradiation can be made with high accuracy and acceptable throughput and without causing charge-up even if an electron beam is irradiated under such conditions as, for example, acceleration voltage of 30 to 100 kV and current density of 10 to 200 A/cm$^2$.

Hereinbelow, each material used in the foregoing process will be explained simply.

Firstly, in the case that the substrate to be processed 2 is a photomask blank, the substrate has on the photomask substrate an optically functional film such as a light-shielding film and a phase shift film, or a hard mask film and the like that can process them precisely; and here, the substrate having a surface layer (thin film) comprised of material containing a transition metal or a transition metal having a light element such as oxygen, nitrogen, and carbon, and the substrate having a surface layer (thin film) comprised of a silicon compound material containing a transition metal or a transition metal having a light element such as oxygen, nitrogen, and carbon may be mentioned. Especially material of a metal chrome and a chrome having a light element such as oxygen, nitrogen, and carbon (see for example, Japanese Patent Laid-Open (Kokai) No. 2007-33469 and Japanese Patent Laid-Open (Kokai) No. 2007-241060) are frequently used as a surface layer (thin film) of a photomask blank; and the method according to the present invention can be preferably applied thereto. Here, a monolayer or a multilayer laminate of the foregoing thin films can be the conductive inorganic thin film 1. In the case of the composition comprising a phase shift film having low conductivity and a light-shielding film having high conductivity, the light-shielding film is formed in a manner to cover the phase shift film, so that the phase shift film may not expose from the light-shielding film; and as a result, there is a merit that charge-up is difficult to occur during an electron beam drawing.

In the case that the substrate is a substrate for forming a nanoinprint mold (see for example, Japanese Patent Laid-Open (Kokai) No. 2005-345737 and International Patent Laid-Open Publication No. 2009/93661), a substrate such as quartz, having on its surface a transition metal auxiliary film or a thin film of a processed transition metal, in particular, a substrate formed with a thin film made of the foregoing material containing a metal chrome or chrome having a light element such as oxygen, nitrogen, and carbon, which have a good track record as a hard mask in photomask blank processing, may be preferably used as the substrate to be processed of the present invention. Here, the thin film or the multilayer laminate as mentioned above can be the conductive inorganic thin film 1.

Then, as to a chemical amplification resist composition for forming the resist film for electron beam 3, a positive type (see, for example Japanese Patent Laid-Open (Kokai) No. 2010-20173) or a negative type (see, for example Japanese Patent Laid-Open (Kokai) No. 2008-249762) can be selected in accordance with an intended pattern. Many resists for electron beam have already been in the public domain, and any of them may be used as far as an intended pattern can be formed as basic properties.

As to the material for the organic conductive film 4, compositions for forming an organic conductive film usable also in a chemical amplification resist in Japanese Patent Laid-Open (Kokai) No. H08-109351, Japanese Patent Laid-Open (Kokai) No. 2006-117925, and so on, as mentioned before, are in the public domain; and in addition, there are commercially available products as well. Here, the material is not particularly limited as far as there are no such problems in resist patterning as intermixing with a resist film, hindering of forming an organic conductive film by a component contained in the composition for forming an organic conductive film, and the like. As the organic conductive material, a polyacetylene derivative, a polypyrrole derivative, a polythiophene derivative, a polyaniline derivative, and the like are known; and in particular, a polythiophene derivative and a polyaniline derivative are preferable materials. For example, a material made of isothianaphthene diyl sulfonate is commercially available from Showa Denko K. K. as the organic conductive film made of a polythiophene derivative, and a material made of polyaniline sulfonic acid is commercially available from Mitsubishi Rayon Co., Ltd. as the organic conductive film made of a polyaniline derivative.

EXAMPLES

Hereinbelow, the present invention will be explained specifically by showing Examples and Comparative Examples; but the present invention is not limited by these Examples.

Example 1

As shown in FIG. 2, a positive resist composition for electron beam SEBP-9012 (positive resist solution of a chemical amplification type, manufactured by Shin-Etsu Chemical Co., Ltd.) was applied by spin coating at 2700 rpm on the 152-mm square photomask blank whose outermost surface is the inorganic conductive light-shielding film 1 formed of a chromium oxynitride composition film (sheet resistivity of about 30 Ω/square) to obtain the coated resist film for electron beam 3 with the thickness of 150 nm as the film thickness of the resist film for electron beam before exposure and after heating. Then, the resist film for electron beam 3 coated by the foregoing procedure was removed with the width of 1.5 mm on each of substrate's four sides inside the surface to be processed 2' than a virtual intersection line L between the substrate's side surface 2" and the surface to be processed 2' of the substrate to be processed 2, thereby forming a peripheral form of an exposed part of the conductive inorganic thin film in the peripheral edge of the substrate; and thereafter, baking was done on a hot plate at 110° C. for 10 minutes to obtain the resist film for electron beam 3 having the thickness of 150 nm.

Figure 4:
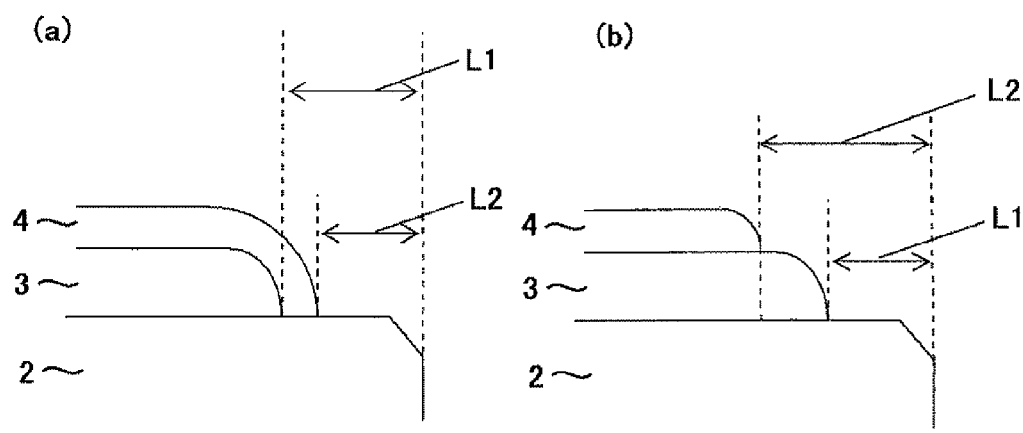
FIG. 4 shows (a) a part of cross section view of the substrate to be processed having laminated thereon a resist film for an electron beam and an organic conductive film in Examples, and (b) a part of cross section view of the substrate to be processed having laminated thereon a resist film for an electron beam and an organic conductive film in Comparative Examples.

Then, on this photomask blank, the composition for forming a conductive organic film 1 (ESPACER 300AX1, manufactured by Showa Denko K. K.) was applied by spin coating at 1500 rpm; and then the organic conductive film 4 thus coated was removed with the width of 1.0 mm on each of substrate's four sides inside the surface to be processed 2' than a virtual intersection line L between the substrate's side surface 2" and the surface to be processed 2' of the substrate to be processed 2, thereby forming a peripheral form of the exposed peripheral part 2b of the conductive inorganic thin film in the peripheral edge of the substrate. Thereafter, this photomask blank 2 was baked on a hot plate at 90° C. for 10 minutes to obtain the organic conductive film 4 having the thickness of 5 nm. In FIG. 4A, a part of cross section view of the substrate to be processed 2 having laminated thereon the resist film for electron beam 3 and the organic conductive film 4 thus manufactured, is shown.

Figure 5:
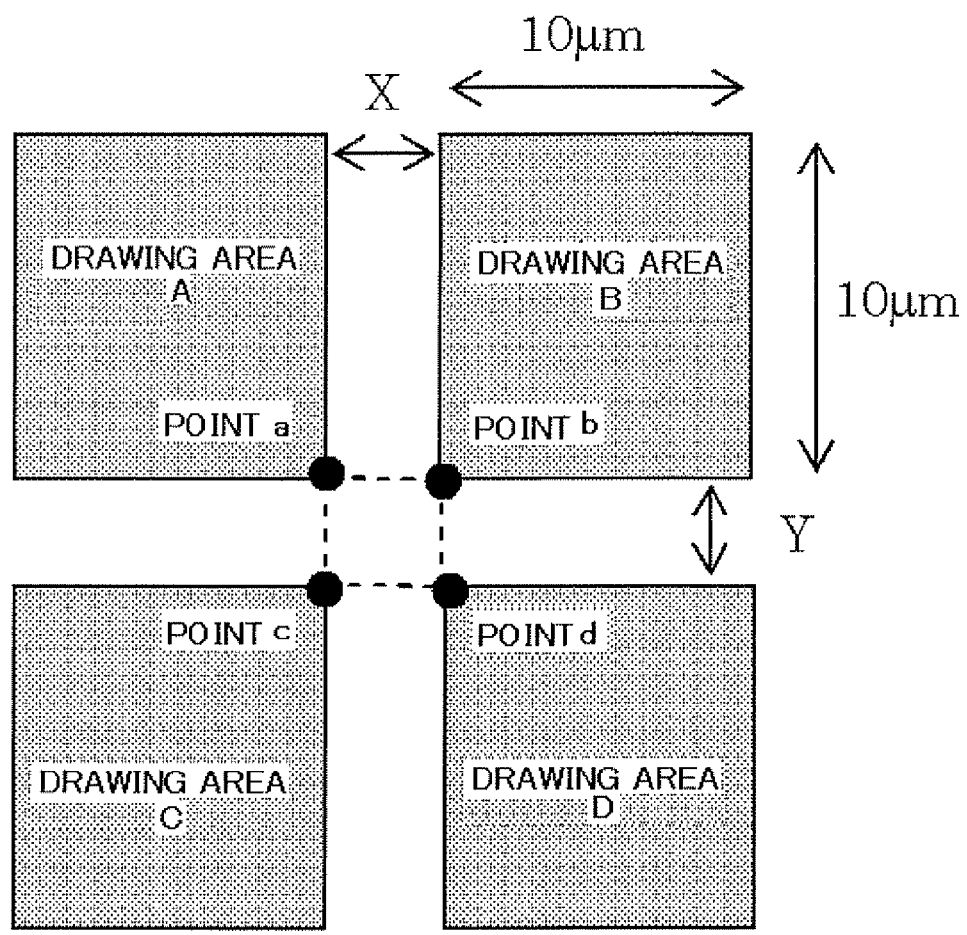
FIG. 5 is a diagram showing a design draw pattern used in Examples and Comparative Examples.

The photomask blank 2 thus obtained was arranged in an electron-beam exposing apparatus (EBM5000+: acceleration voltage of 50 keV, manufactured by NuFLARE Technology, Inc.), and then earth was set on a chamfer of the substrate and connected to the conductive inorganic thin film 1 at the intersection point between the surface to be processed 2' and the chamfer; and thereafter an electron beam was irradiated according to the model pattern of FIG. 5 with an average current density of 70 A/cm² per unit time.

Thereafter, the organic conductive film 4 was removed by running purified water for one minute with rotating the substrate, and the post-exposure baking was done at 110° C. for 10 minutes; and then the spray development was conducted by aqueous 2.38% tetramethylammonium hydroxide to obtain a positive test pattern.

Accuracy of the obtained test pattern was determined as following. Namely, the design draw pattern was made in a manner that four patterns A to with 10 μm square might be arranged in two lines and two columns while both distances X and Y between the respective patterns were made 200 nm (the corner points "a" to "d", facing each other inside the four patterns shown in the figure, form a square with 200 nm on a side).

Figure 6:
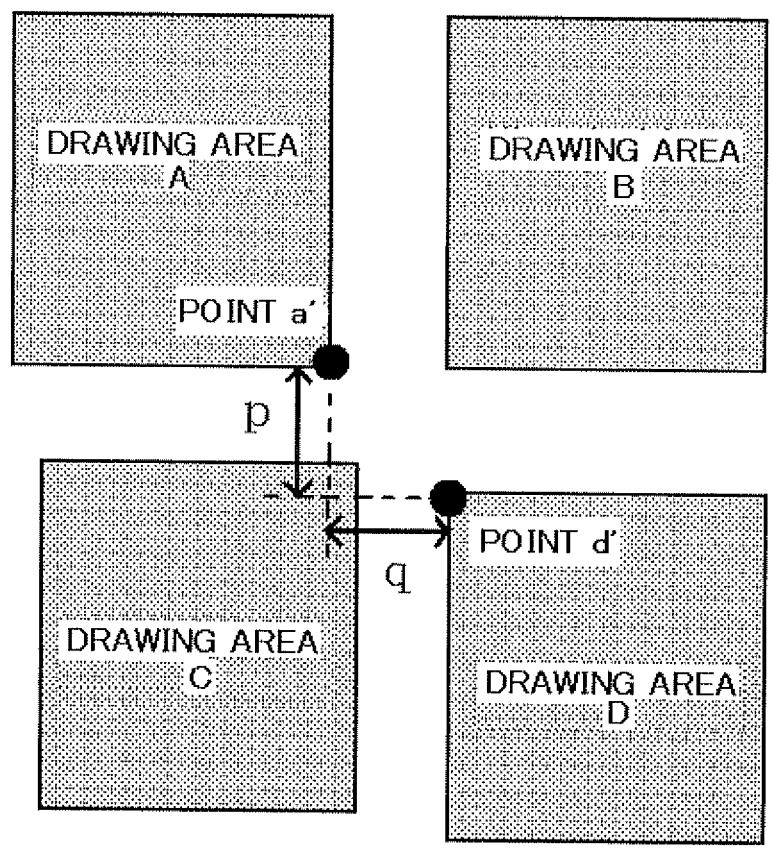
FIG. 6 is a diagram showing a pattern obtained in Examples and Comparative Examples.

The patterning was made by the electron beam irradiation mentioned above with the optimum exposure dose Eop (sensitivity),—the dose amount with which X or Y is resolvable with 200 nm in the widths of the foregoing four patterns A to D)—, and then, as shown in FIG. 6, the length "p", which is the length of the linear line from the corner point a' in the drawing area A to the extended line of the side on the B-side in the drawing area D, and the length "q", which is the length of the linear line from the corner point d' in the drawing area D to the extended line of the side on the B-side of the drawing area A, were measured; and the value calculated from the following equation was taken as the position-misalignment indicator.

$$W=\sqrt{(|p-200|^2+|q-200|^2)} \quad \text{Equation:}$$

W: position-misalignment indicator

According to the above, "p" was 203.3 nm and "q" was 203.8 nm; and thus, the position-misalignment indicator W was 5.0.

Example 2 and Example 3

Each of the substrates to be processed 2, having laminated thereon the organic conductive film 4 and the resist film for electron beam 3, was manufactured and patterned in a manner similar to those of Example 1, except that the composition for forming the organic conductive film 4 was changed to the composition for forming a conductive organic film 2 (aquaSAVE-57F2, manufactured by Mitsubishi Rayon Co., Ltd.) and to the composition for forming a conductive organic film 3 (aquaSAVE-57xs, manufactured by Mitsubishi Rayon Co., Ltd.), respectively. Each of the position-misalignment indicators W was obtained by measuring the respective lengths of the patterns. The results of them including Example 1 are shown in Table 1.

Comparative Examples

Each of the patterning was conducted in a manner similar to those of Examples 1 to 3, except that the width of the resist film for electron beam 3 removed was changed to 1.0 mm inside the surface to be processed 2' than a virtual intersection line L between the substrate's side surface 2" and the surface to be processed 2' of the substrate to be processed 2, and the width of the organic conductive 4 removed was changed to 1.5 mm inside the surface to be processed 2' than a virtual intersection line L between the substrate's side surface and the surface to be processed 2' of the substrate to be processed 2; and then each of the position-misalignment indicators W was obtained by measuring the respective lengths of the patterns. The results of them including Examples are shown in Table 1. Meanwhile, in FIG. 4B, a part of cross section view of the substrate to be processed 2 having laminated thereon the resist film for electron beam 3 and the organic conductive film 4, is shown.

TABLE 1

|  | Material for organic conductive film | Thickness of organic Conductive film (nm) | Distance of resist film from side surface of substrate L1 (mm)* | Distance of organic conductive film from side surface of substrate L2 (mm)* | W (nm) |
|---|---|---|---|---|---|
| Example 1 | Conductive organic film forming composition 1 | 5 | 1.5 | 1.0 | 5.0 |
| Example 2 | Conductive organic film forming composition 2 | 58 | 1.5 | 1.0 | 4.1 |
| Example 3 | Conductive organic film forming composition 3 | 60 | 1.5 | 1.0 | 3.8 |
| Comparative Example 1 | Conductive organic film forming composition 1 | 5 | 1.0 | 1.5 | 14 |
| Comparative Example 2 | Conductive organic film forming composition 2 | 58 | 1.0 | 1.5 | 12 |
| Comparative Example 3 | Conductive organic film forming composition 3 | 60 | 1.0 | 1.5 | 13 |

*The distance from the substrate's side surface means the distance of the removal toward inside the surface to be processed 2' from a virtual intersection line L between the substrate's side surface 2" and the surface to be processed 2' of the substrate to be processed 2.

From the results shown above, it can be seen that the average misalignment from the intended position in the resist pattern was 13 nm in Comparative Examples 1 to 3, while the average misalignment in Examples 1 to 3 was 4.3 nm, showing that the resist pattern with high position accuracy could be obtained in Examples 1 to 3.

From the results shown above, it became clear that, when the photomask blank (substrate to be processed) of the present invention having an area where the conductive inorganic thin film in the resist underlayer and the organic conductive film in the resist upper layer contacted directly was used, charge-up could be effectively prevented even if an electron beam with high current density was irradiated, so that position misalignment of the resist pattern during irradiation of a high energy electron beam could be prevented in the electron beam lithography.

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:

1. A substrate to be processed, before pattern-irradiation by an electron beam, having laminated thereon a resist film for electron beam and an organic conductive film, in which at least a resist film for electron beam and an organic conductive film are laminated in order on a substrate to be processed having a conductive inorganic thin film as its surface layer, wherein a surface to be processed of the substrate to be processed has an area of direct contact between the organic conductive film and the conductive inorganic thin film in part thereof.

2. The substrate to be processed having laminated thereon a resist film for an electron beam and an organic conductive film according to claim 1, wherein the surface to be processed of the substrate to be processed has an area where the conductive inorganic thin film is appeared out.

3. The substrate to be processed having laminated thereon a resist film for an electron beam and an organic conductive film according to claim 2, wherein the area where the conductive inorganic thin film is appeared out is arranged with a certain width in a surrounding area inside the surface to be processed than a virtual intersection line between a side surface of the substrate to be processed and the surface to be processed of the substrate to be processed, and the area of direct contact between the organic conductive film and the conductive inorganic thin film is arranged in a peripheral form with a prescribed width inside the surface to be processed than the surrounding area having a certain width.

4. The substrate to be processed having laminated thereon a resist film for an electron beam and an organic conductive film according to claim 3, wherein the width of the area of direct contact between the organic conductive film and the conductive inorganic thin film, arranged in a peripheral form with a prescribed width, is 0.3 mm or more.

5. The substrate to be processed having laminated thereon a resist film for an electron beam and an organic conductive film according to claim 1, wherein the substrate to be processed is a photomask blank.

6. The substrate to be processed having laminated thereon a resist film for an electron beam and an organic conductive film according to claim 2, wherein the substrate to be processed is a photomask blank.

7. The substrate to be processed having laminated thereon a resist film for an electron beam and an organic conductive film according to claim 3, wherein the substrate to be processed is a photomask blank.

8. The substrate to be processed having laminated thereon a resist film for an electron beam and an organic conductive film according to claim 4, wherein the substrate to be processed is a photomask blank.

9. A resist patterning process, wherein the substrate to be processed having laminated thereon a resist film for electron beam and an organic conductive film according to claim 1 is used and the conductive inorganic thin film or the organic conductive film is connected to earth, and thereafter, pattern-irradiation is conducted on the resist film for electron beam formed on the substrate to be processed by using an electron beam having current density of 10 A/cm$^2$ or more per unit time.

10. A resist patterning process, wherein
the substrate to be processed having laminated thereon a resist film for electron beam and an organic conductive film according to claim 2 is used and the conductive inorganic thin film or the organic conductive film is connected to earth, and thereafter
pattern-irradiation is conducted on the resist film for electron beam formed on the substrate to be processed by using an electron beam having current density of 10 A/cm$^2$ or more per unit time.

11. A resist patterning process, wherein
the substrate to be processed having laminated thereon a resist film for electron beam and an organic conductive film according to claim 3 is used and the conductive inorganic thin film or the organic conductive film is connected to earth, and thereafter
pattern-irradiation is conducted on the resist film for electron beam formed on the substrate to be processed by using an electron beam having current density of 10 A/cm$^2$ or more per unit time.

12. A resist patterning process, wherein
the substrate to be processed having laminated thereon a resist film for electron beam and an organic conductive film according to claim 4 is used and the conductive inorganic thin film or the organic conductive film is connected to earth, and thereafter
pattern-irradiation is conducted on the resist film for electron beam formed on the substrate to be processed by using an electron beam having current density of 10 A/cm$^2$ or more per unit time.

13. A resist patterning process, wherein
the substrate to be processed having laminated thereon a resist film for electron beam and an organic conductive film according to claim 5 is used and the conductive inorganic thin film or the organic conductive film is connected to earth, and thereafter
pattern-irradiation is conducted on the resist film for electron beam formed on the substrate to be processed by using an electron beam having current density of 10 A/cm$^2$ or more per unit time.

14. A resist patterning process, wherein
the substrate to be processed having laminated thereon a resist film for electron beam and an organic conductive film according to claim 6 is used and the conductive inorganic thin film or the organic conductive film is connected to earth, and thereafter
pattern-irradiation is conducted on the resist film for electron beam formed on the substrate to be processed by using an electron beam having current density of 10 A/cm$^2$ or more per unit time.

15. A resist patterning process, wherein
the substrate to be processed having laminated thereon a resist film for electron beam and an organic conductive film according to claim 7 is used and the conductive inorganic thin film or the organic conductive film is connected to earth, and thereafter,
pattern-irradiation is conducted on the resist film for electron beam formed on the substrate to be processed by using an electron beam having current density of 10 A/cm$^2$ or more per unit time.

16. A resist patterning process, wherein the substrate to be processed having laminated thereon a resist film for electron beam and an organic conductive film according to claim 8 is used and the conductive inorganic thin film or the organic conductive film is connected to earth, and thereafter pattern-irradiation is conducted on the resist film for electron beam formed on the substrate to be processed by using an electron beam having current density of 10 A/cm$^2$ or more per unit time.

17. A method for manufacturing a substrate to be processed, before pattern-irradiation by an electron beam, having laminated thereon a resist film for electron beam and an organic conductive film in which at least a resist film for electron beam and an organic conductive film are laminated in order on a substrate to be processed having a conductive inorganic thin film as its surface layer, wherein the method comprises at least:

(1) a step of forming a resist film for electron beam on entire of a substrate to be processed and removing a part of the resist film for electron beam, thereby forming an area where a conductive inorganic thin film as a surface layer of the substrate to be processed is appeared out, and (2) a step of forming the organic conductive film on entire of the substrate to be processed having laminated thereon the partly removed resist film for electron beam; and thereby a substrate to be processed having laminated thereon a resist film for electron beam and an organic conductive film, whose surface to be processed has an area of direct contact between the organic conductive film and the conductive inorganic thin film in part thereof inside the area where the conductive inorganic thin film is appeared out by removing a part of the resist film for electron beam, is manufactured.

18. The method for manufacturing a substrate to be processed having laminated thereon a resist film for electron beam and an organic conductive film according to claim 17, wherein removal of the resist film for electron beam in the step (1) is conducted in a substrate surrounding area with a certain first width inside the surface to be processed than a virtual intersection line between the side surface of the substrate to be processed and the surface to be processed of the substrate to be processed.

19. The method for manufacturing a substrate to be processed having laminated thereon a resist film for electron beam and an organic conductive film according to claim 18, wherein, after the step (2), the organic conductive film is removed in a peripheral form with a certain second width inside the surface to be processed than a virtual intersection line between the side surface of the substrate to be processed and the surface to be processed of the substrate to be processed, wherein the certain second width is narrower than the certain first width by 0.3 mm or more, and the surface to be processed of the substrate to be processed has the area of direct contact between the organic conductive film and the conductive inorganic thin film in part thereof inside than the area where the conductive inorganic thin film is appeared out.

* * * * *